United States Patent [19]
Choi

[11] Patent Number: 5,905,674
[45] Date of Patent: May 18, 1999

[54] NONVOLATILE MEMORY AND METHOD OF PROGRAMMING THE SAME

[75] Inventor: Woong-Lim Choi, Kyungki-do, Rep. of Korea

[73] Assignee: LG Semicon Co., Ltd., Chungcheongbuk-Do, Rep. of Korea

[21] Appl. No.: 09/042,022

[22] Filed: Mar. 13, 1998

Related U.S. Application Data

[62] Division of application No. 08/537,327, Sep. 29, 1995, Pat. No. 5,745,412.

[30] Foreign Application Priority Data

Aug. 21, 1995 [KR] Rep. of Korea .................. 95-25761

[51] Int. Cl.$^6$ .................................................. G11C 11/34
[52] U.S. Cl. .................................. 365/185.1; 365/185.01
[58] Field of Search ...................... 257/315; 365/185.01, 365/185.1

[56] References Cited

U.S. PATENT DOCUMENTS

| | | | |
|---|---|---|---|
| 4,331,968 | 5/1982 | Gosney, Jr. et al. | 357/23 |
| 4,558,344 | 12/1985 | Perlegos | 357/59 |
| 5,043,940 | 8/1991 | Harari | 365/168 |
| 5,047,362 | 9/1991 | Bergemont | 437/52 |
| 5,081,054 | 1/1992 | Wu et al. | 437/43 |
| 5,163,021 | 11/1992 | Mehrotra et al. | 365/185 |
| 5,268,318 | 12/1993 | Harari | 437/43 |
| 5,394,362 | 2/1995 | Banks | 365/189.01 |
| 5,422,842 | 6/1995 | Cernea et al. | 365/185 |
| 5,468,663 | 11/1995 | Bertin et al. | 437/43 |
| 5,482,880 | 1/1996 | Kaya et al. | 437/43 |
| 5,646,430 | 7/1997 | Kaya et al. | 257/322 |
| 5,753,950 | 5/1998 | Kojima | 257/315 |

OTHER PUBLICATIONS

"A Multilevel–Cell 32Mb Flash Memory", Bauer, M. Et al., Digest of Technical Papers, IEEE International Solid–State Circuits Conference, pp. 132–133, Feb. 16, 1995.

"A 34Mb 3.3V Serial Flash EEPROM for Solid–State Disk Applications", Cernea, R. Et al., Digest of Technical Papers, IEEE International Solid–State Circuits Conference, pp. 126–127, Feb. 16, 1995.

*Primary Examiner*—David Nelms
*Assistant Examiner*—M. Tran
*Attorney, Agent, or Firm*—Morgan, Lewis & Bockius LLP

[57] ABSTRACT

A nonvolatile memory cell includes a floating gate; a programming region, having a first current path to the floating gate, for programming by providing charge carriers to the floating gate through the first current path or extracting charge carriers stored in the floating gate; and a verification region, having a second current path separated from the first current path, for verifying the charge amount of the floating gate through the second current path during programming.

12 Claims, 20 Drawing Sheets

FIG.5E

F I G.9A
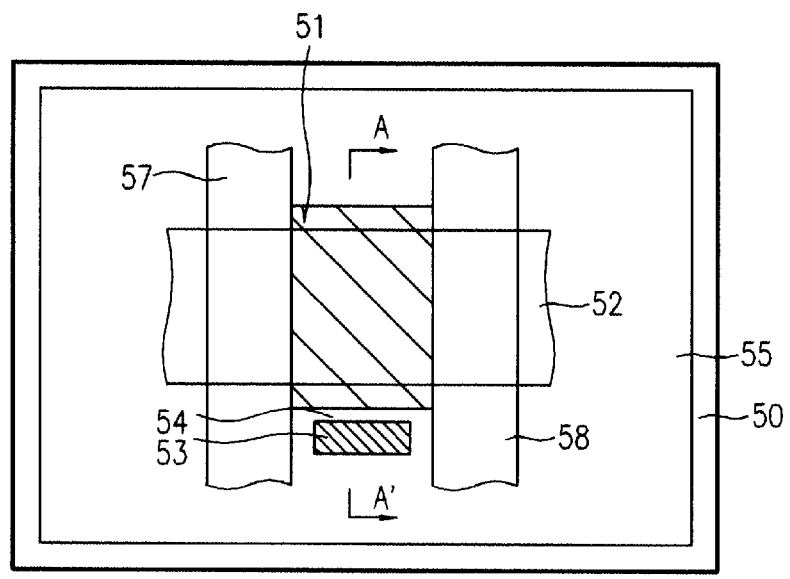
F I G.9B
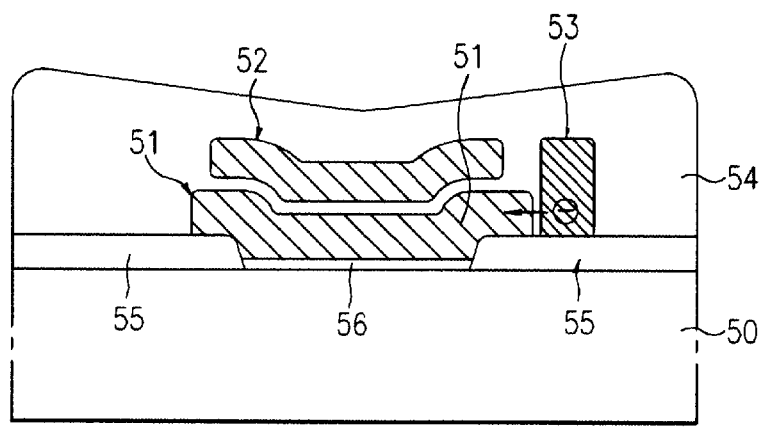

F I G. 13A
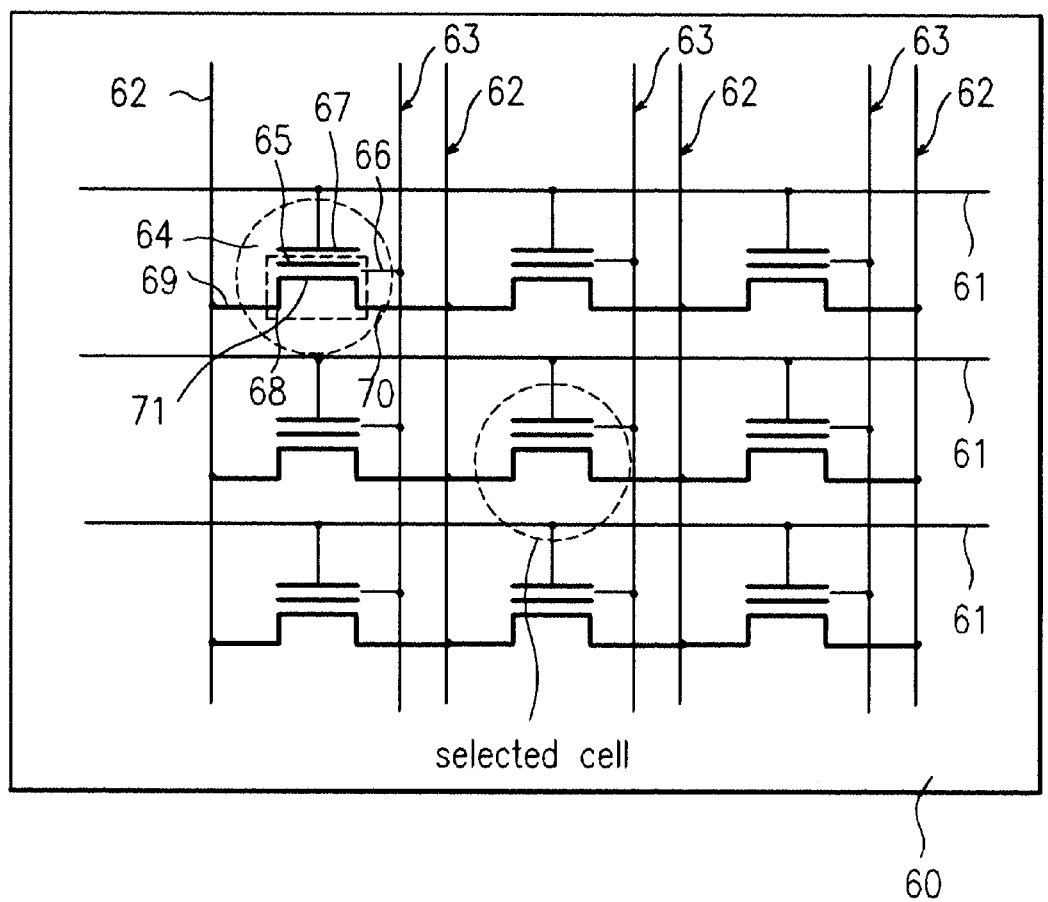

FIG. 13B

| | P.L(S) | P.L(US) | W.L(S) | W.L(US) | B.L(S) | B.L(US) | SUBSTRATE | |
|---|---|---|---|---|---|---|---|---|
| PROGRAM | −8~−15V | 0 | 3~12V | −0~−10V | −0.5~−2V | 0(LEFT) 0.5~2V (RIGHT) | 0 | |
| ERASE | 0~12V | 0~12V | −7~12V | −7~12V | 0~6V | FLOATING | 0 | B.L ERASE |
|  | 0~12V | 0~12V | −7~12V | −7~12V | FLOATING | FLOATING | 0~6V | SUBSTRATE ERASE |
| READ | 0 | 0 | Vcc | 0 | 0.5~2V | 0(LEFT) 0.5~2V (RIGHT) | 0 | |

S:Selected, US:unselected
Vcc:Supply voltage

F I G. 14
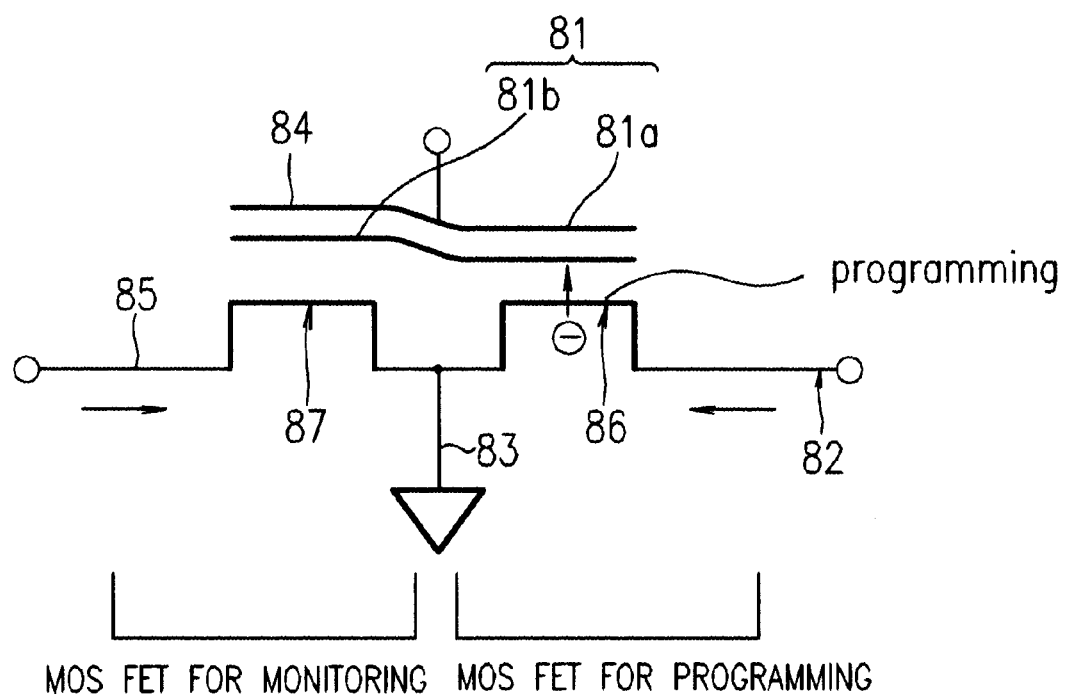

F I G. 15A
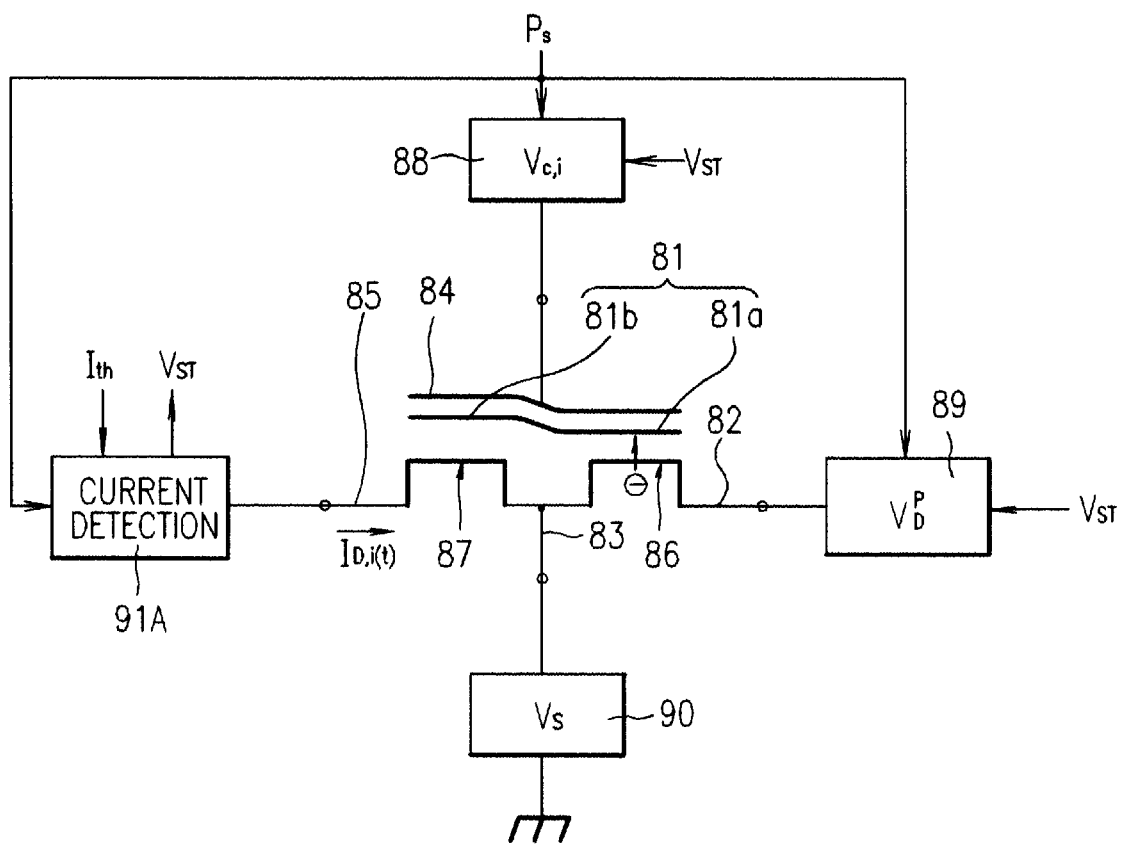
F I G. 15B
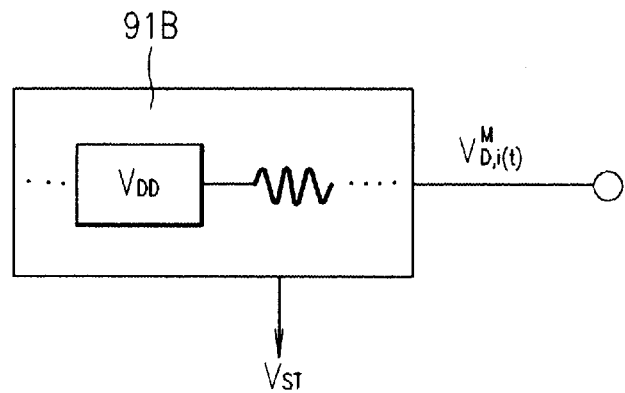

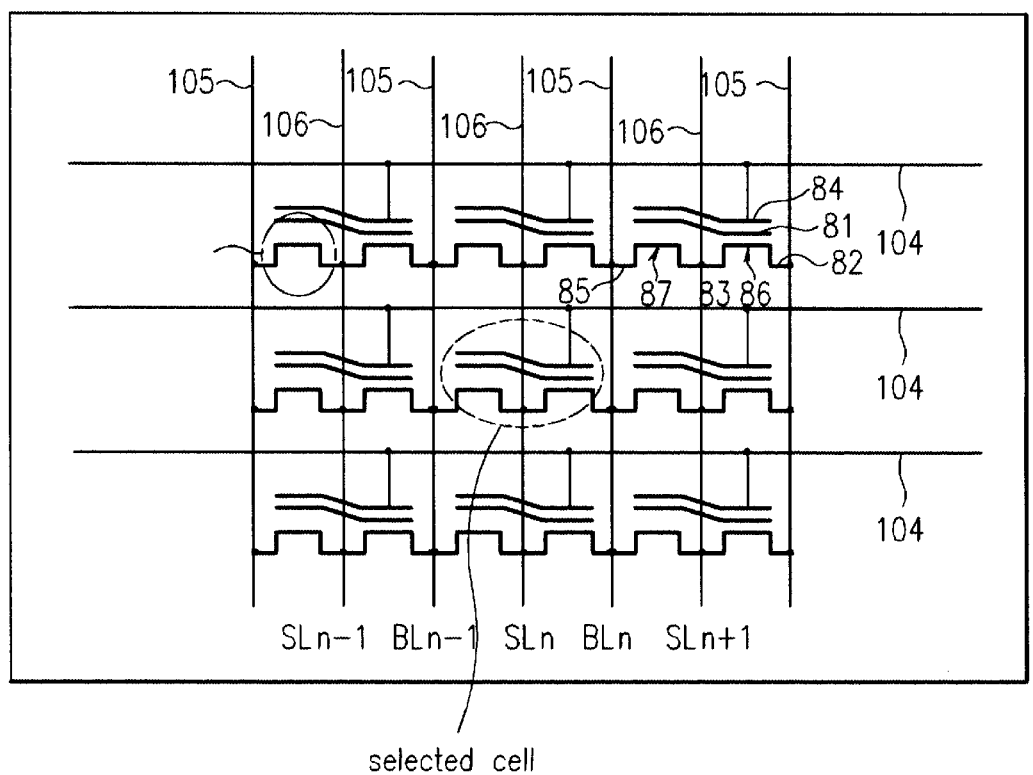
F I G.17A

FIG. 17B (Unit:Volts)

| | WL(S) | WL(US) | BL | SL | SUBSTRATE |
|---|---|---|---|---|---|
| PROGRAM (HCI) | 6~13 | 0 | BLn:5~9<br>BLn-1:0.5~2<br>OTHERS:0 | SLn:0<br>SLn+1:FLOAT<br>SLn-1:BLn-1<br>OTHERS:0 | 0 |
| PROGRAM (TUNNEL) | 10~20 | 0 | BLn:0<br>OTHERS:5~10 | SLn:0<br>OTHERS:5~10 | 0 |
| ERASE | −7~−12 | | FLOAT | Vcc | 0 |
| READ | Vcc | 0 | BLn:0.5~2<br>OTHERS:0 | 0 | 0 |

S:SELECTED, US:UNSELECTED, BLn:SELECTED $n^{th}$ BL,
BLn-1:SELECTED $(n-1)^{th}$ BL, SLn:SELECTED $N^{th}$ SL,
SLn-1:UNSELECTED $(n-1)^{th}$ SL, SLn+1:UNSELECTED $(n+1)^{th}$ SL
HCI:HOT CARRIER INJECTION, Vcc:SUPPLY VOLTAGE

NONVOLATILE MEMORY AND METHOD OF PROGRAMMING THE SAME

This is a divisional of application(s) application Ser. No. 08/537,327 filed on Sep. 29, 1995, now U.S. Pat. No. 5,745,412.

BACKGROUND OF THE INVENTION

1. Field of the Invention

The present invention relates to a nonvolatile memory and a method of programming the nonvolatile memory.

2. Discussion of the Related Art

Generally, for nonvolatile semiconductor memory devices for mass storage media such as EEPROM and flash EEPROM, the drawback that is the most difficult to overcome is the high cost-per-bit of the memories. In order to solve such a problem, studies on multibit cell have been recently proposed.

The packing density of a conventional nonvolatile memory corresponds in a one to one fashion to the number of memory cells. A multibit cell stores data of over two bits in one memory cell, thus enhancing the density of data on the same chip area without reducing the size of the memory cell.

For the multibit cell, more than three threshold voltage levels should be programmed on respective memory cells. For instance, in order to store data of two bits for every cell, the respective cells must be programmed in $2^2$, that is, four, threshold levels. Here, the four threshold levels correspond to logic states 00, 01, 10, and 11, respectively.

In the multi-level program, the most critical problem is that the respective threshold voltage levels have a statistical distribution. The distribution value is about 0.5 V.

As distribution is reduced by precisely adjusting the respective threshold levels, more levels can be programmed, which in turn increases the number of bits for every cell. To reduce the voltage distribution, there exists a method of programming using repeated programming and verification.

According to this method, a series of voltage pulses are applied to the cells in order to program the nonvolatile memory cell at intended threshold levels. To verify whether a cell reaches an intended threshold level, a read operation is performed between the respective programming voltage pulses.

During verification, when the verified threshold level reaches the intended threshold level, programming stops. For this method of repeated programming and verification, it is hard to reduce the error distribution of the threshold level due to the limited pulse width of a program voltage. In addition, the algorithm of repeated programming and verification is implemented with an additional circuit, which increases the area of peripheral circuits of the chip. Furthermore, the repetitive method prolongs the programming time. In order to solve such a drawback, R. Cernea of SunDisk Co., Ltd. suggested a method of simultaneous programming and verification.

FIG. 1A illustrates the symbol and circuit diagram of the nonvolatile memory proposed by Cernea. As shown in FIG. 1A, the nonvolatile memory cell is composed of a control gate 1, floating gate 2, source 3, channel area 4, and drain 5.

When voltages sufficient to cause programming are applied to control gate 1 and drain 5, a current flows between drain 5 and source 3. This current is compared to a reference current and when the current reaches a value equal to or smaller than the reference current, a programming completion signal is produced.

The above-mentioned procedure is illustrated in FIG. 1B. According to this prior art, verification is automatically performed at the same time as programming, which compensates for the drawbacks of the repetitive method in which programming and verification are repeated in succession.

However, in Cerneal's method, a program gate for programming is not used separately. Further, this method does not use a structure in which a programming current path and sensing (or verifying) current path are completely separated. For this reason, in Cernea's method, programming and sensing are difficult to optimize individually. The programming current and monitoring current are not separated so that the cell's threshold voltages are difficult to control and adjust directly. Conventionally, however, multi-level programming has been performed in such a manner that the voltages applied to the respective parts of a memory cell are fixed, and reference currents corresponding to the respective levels are varied. In this method, as shown in FIG. 1B, reference currents for detection have no explicit relation with the cell threshold voltages, and are not linear with them.

The cell structure of an EEPROM or a flash EEPROM is roughly divided into two parts, depending upon where the floating gate is placed on the channel area. The first structure is a simple-stacked gate structure in which the floating gate completely covers the cell channel area. The second one is a split-channel structure in which the floating gate covers only part of the channel area between the source and drain.

In the channel area, a portion where the floating gate is not present is called a transfer transistor, which is introduced to eliminate over-erasure problem. The split-channel cell is undesirably larger than the simple-stacked gate structure.

Another classification type of flash EEPROM depends on whether a double polysilicon gate or triple polysilicon gate is used. The double polysilicon gate is usually employed in the simple-stacked structure. The triple polysilicon gate is used in the split-channel cell. The EEPROM or flash EEPROM memory cells are disclosed in detail in U.S. Pat. No. 5,268,318. Conventionally, the third gate in the triple polysilicon gate is an erasing gate used merely for data erasure. In the flash EEPROM, erasure is performed in units of blocks made up of a plurality of cells.

FIG. 2A is a diagram of a conventional nonvolatile memory cell having a simple-stacked gate. FIG. 2B is a diagram of a conventional nonvolatile memory cell having a split-channel structure. FIGS. 2A and 2B show programming and erasing processes as well as the structure of the conventional nonvolatile memory cells.

As shown in FIG. 2A, the conventional stacked gate memory cell includes a control gate 6, a floating gate 7, a source 8, a drain 9, a channel area 10, and an erasing gate 11. As shown in FIG. 2B, the conventional split channel memory cell includes a control gate 13, a floating gate 14, a source 15, a drain 16, a channel area 17, and an erasing gate 18.

In FIGS. 2A and.2B, erasing gates 11 and 18 are not required for programming. Therefore, during programming, the conventional cells of FIGS. 2A and 2B have substantially the same structure as the double polysilicon gate.

In the prior art, programming is carried out only with the control gate, source, and/or drain electrodes so that it is difficult to separate the program current path and verification (sensing) current path within the memory cell for simultaneous programming and verification. Accordingly, it is difficult to control the multi-levels directly and effectively.

SUMMARY OF THE INVENTION

The present invention has been made in view of the above circumstances and has as an object to provide a nonvolatile memory and a method of programming the nonvolatile memory, in which verification is performed at the same time as double or multilevel programming, and in which programming and verifying areas are completely separated.

It is another object of the present invention to provide a nonvolatile memory and a method of programming the nonvolatile memory, in which, during multilevel programming, respective threshold levels are controlled with a voltage applied to the control gate, and the respective threshold levels and voltages correspondingly applied to the control gate are linear with respect to each other.

It is still another object of the present invention to provide a nonvolatile memory and a method of programming the nonvolatile memory, in which over-erasure problem is eliminated with a simple-stacked structure having no transfer transistor, and the cell area is reduced to become more compact.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the nonvolatile memory cell, of this invention comprises: a floating gate; a programming region, having a first current path to the floating gate, for programming by providing charge carriers to the floating gate through the first current path or extracting charge carriers stored in the floating gate; and a verification region, having a second current path separated from the first current path, for verifying the charge amount of the floating gate through the second current path during programming.

To further achieve the objects of the present invention, there is provided a nonvolatile memory cell comprising: a floating gate; a program gate for providing charge carriers to the floating gate for the purpose of programming; a control gate for controlling the amount of charge carriers provided to the floating gate for programming; and a field effect transistor, including the floating gate, a source, a drain, and a channel area between the source and drain, and for verifying charge carriers provided to the floating gate during programming.

To still further achieve the objects of the present invention, there is provided, in a nonvolatile memory cell comprising a control gate, a floating gate, a program gate, and a transistor having a threshold voltage and including the floating gate, a source, a drain, and a channel area between the drain and source, a method of programming the nonvolatile memory cell comprising the steps of: supplying a first voltage to the control gate and a second voltage to the program gate so that charge carriers for programming are fed to the floating gate from the program gate and an inversion layer is formed in the channel area; and monitoring the conductivity of the inversion layer during programming and stopping the supply of at least one of the first voltage and second voltage to the control gate and the program gate when the monitored conductivity reaches a reference value.

To still yet further achieve the objects of the present invention, there is provided a nonvolatile memory cell comprising: a floating gate divided into first and second areas; a programming field effect transistor including the first area corresponding to part of the floating gate, a first drain, and a common source, a channel area between the first drain and the common source and having a first threshold voltage for supplying charge carriers to the floating gate for the purpose of programming; a control gate for controlling the amount of charge carriers supplied to the floating gate for programming; and a monitoring field effect transistor including the second area of the floating gate excluding the first area, a second drain, and the common source, a channel area between the second drain and the common source and having a second threshold voltage for verifying the amount of charge carriers supplied to the floating gate during programming.

To even yet still further achieve the objects of the present invention, there is provided, in a nonvolatile memory cell comprising a control gate, a floating gate divided into first and second areas; a programming field effect transistor including the first area of the floating gate, a first drain, a common source, and a first channel area between the first drain and common source, and having a first threshold voltage; and a monitoring field effect transistor including the second area of the floating gate, a second drain, and the common source, and a second channel area between the second drain and common source, and having a second threshold voltage, a method of programming the nonvolatile memory cell comprising the steps of: supplying a first voltage to the control gate and a second voltage to the first drain so that charge carriers for programming are fed to the floating gate through the first channel area for programming and an inversion layer is formed in the second channel area; and monitoring the conductivity of the inversion layer during programming and stopping the supply of at least one of the first voltage and second voltage to the control gate and the first drain when the monitored conductivity reaches a reference value.

BRIEF DESCRIPTION OF THE DRAWINGS

The accompanying drawings, which are incorporated in and constitute a part of this specification illustrate embodiments of the invention and, together with the description, serve to explain the objects, advantages, and principles of the invention. In the drawings:

FIGS. 5A–5I are diagrams of waveforms present at the respective nodes of FIG. 4;

FIG. 9A is a layout of the first structure of the nonvolatile memory according to the first embodiment of the present invention;

FIG. 9B is a cross-sectional view of the first structure of the nonvolatile memory cut along line A–A' of FIG. 9A;

FIG. 13A is a circuit diagram of a nonvolatile memory device using the nonvolatile memory cell of FIG. 3B;

FIG. 13B is a table showing voltages supplied to the respective lines of FIG. 13A during operation;

FIG. 14 is a circuit diagram of a second embodiment of the nonvolatile memory of the present invention;

FIG. 15A is a diagram for explaining a programming method according to the second embodiment of the present invention;

FIG. 15B is a diagram of a voltage detector used instead of the current detector of FIG. 15A;

FIG. 17A is a circuit diagram of a nonvolatile memory device using the nonvolatile memory cell of FIG. 14; and FIG. 17B is a table showing voltages supplied to the respective lines of FIG. 17A during operation.

DETAILED DESCRIPTION OF THE PREFERRED EMBODIMENTS

First Embodiment

Figure 1A:
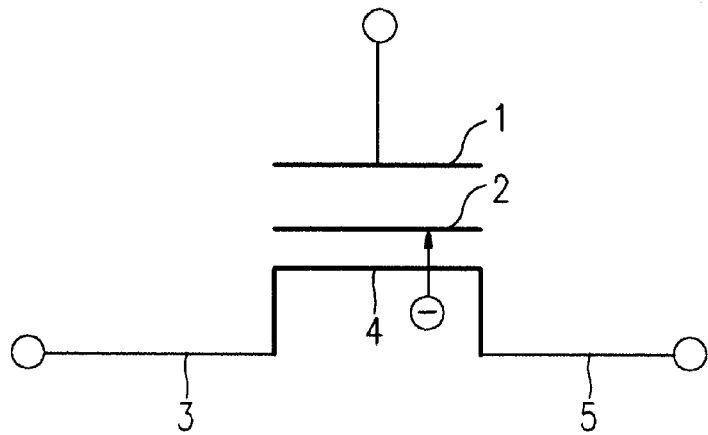
FIG. 1A is a circuit diagram of a conventional nonvolatile memory cell.
Figure 1B:
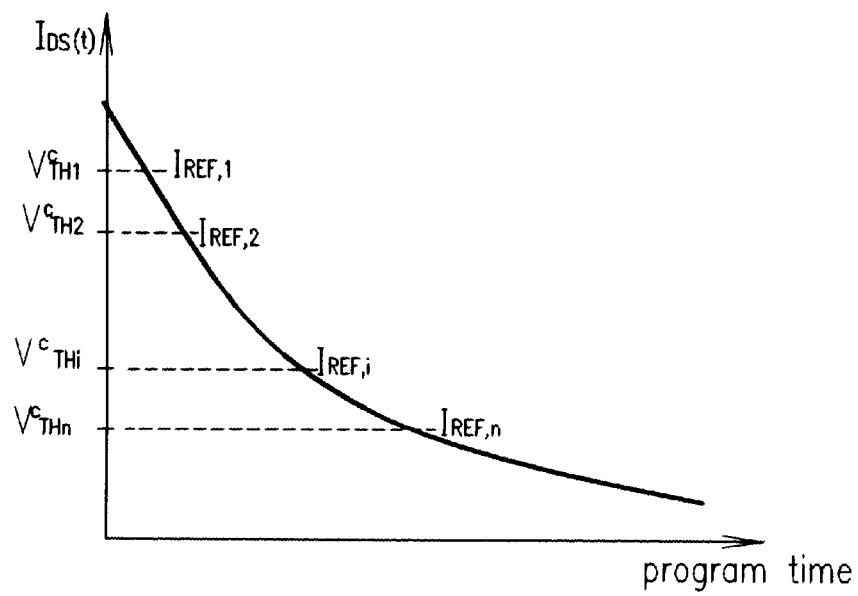
FIG. 1B is a graph for explaining the automatic verification/programming principle of the conventional nonvolatile memory of FIG. 1A.
Figure 2A:
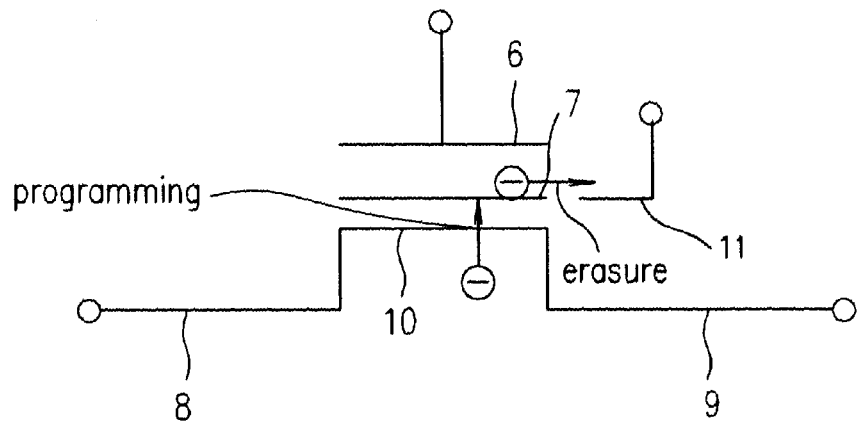
FIG. 2A is a circuit diagram of a conventional nonvolatile memory having a simple-stacked gate.
Figure 2B:
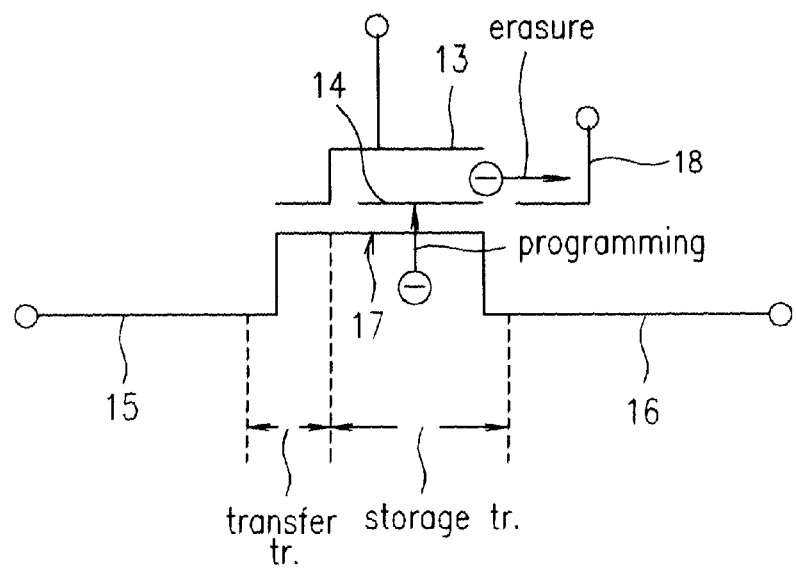
FIG. 2B is a circuit diagram of a conventional nonvolatile memory having a split-channel structure.
Figure 3A:
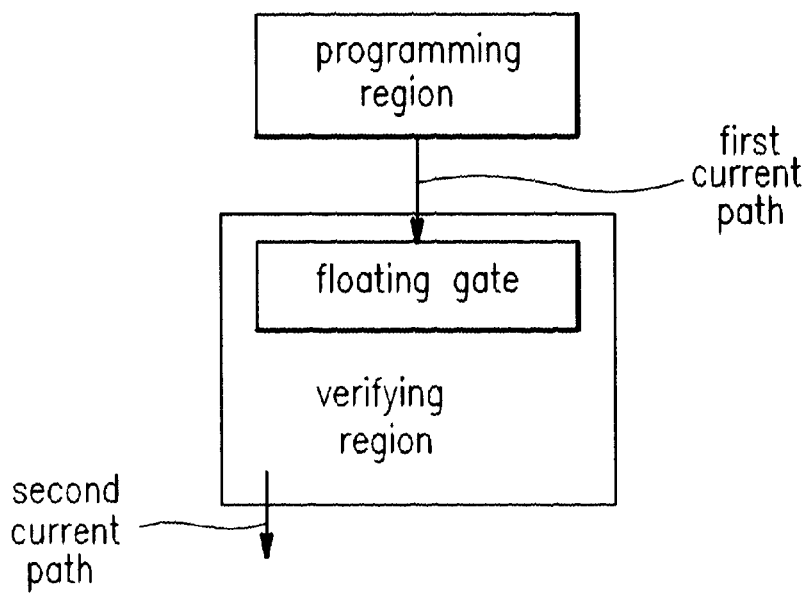
FIG. 3A is a block diagram of a nonvolatile memory cell of the present invention.

Referring to FIG. 3A, a nonvolatile memory cell comprises a floating gate, a programming region, having a first current path to the floating gate, for programming by providing charge carriers to the floating gate through the first current path or extracting charge carriers stored in the floating gate, and a verification region, having a second current path separated from the first current path for verifying the charge amount of the floating gate through the second current path during programming.

Figure 3B:
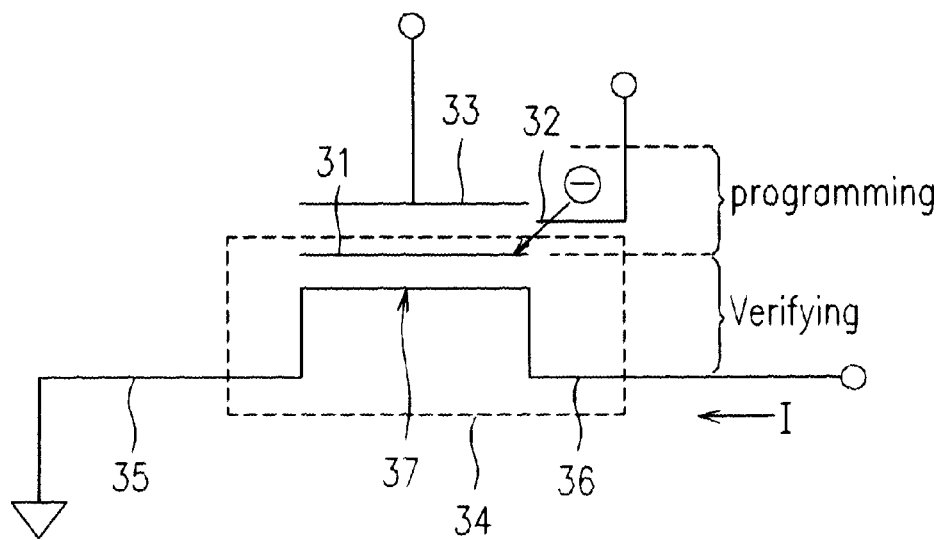
FIG. 3B is a circuit diagram of a first embodiment of nonvolatile memory of the present invention.

Turning to FIG. 3B, a nonvolatile memory cell comprises a floating gate 31, a program gate 32 for providing negative charges (electrons) or positive charges (holes) to floating gate 31 for the purpose of double or multi-level programming, a control gate 33 for providing voltage to floating gate 31 by capacitive coupling between the control gate and floating gate and controlling the amount of charges provided to floating gate 31 from program gate 32 for the purpose of programming, and a transistor 34 for verifying (or sensing) charges provided to floating gate 31 during double or multi-level programming. In FIG. 3B, transistor 34 includes floating gate 31, a source 35, a drain 36, and a channel area 37 between source 35 and drain 36.

As shown in FIG. 3B, the nonvolatile memory of the present invention is constructed to perform double or multi-level programming, using a third program gate 32, and to verify whether the programming is completed or not by checking the amount of charges supplied to floating gate 31 during the double or multi-level programming.

Control gate 33, floating gate 31, and program gate 32 may perform only double or multi-level programming. Conversely, transistor 34 may merely perform monitoring of the amount of charges of floating gate 31 in order to verify whether programming is completed or proceeding. The programming region is separated completely from the verifying region. These two regions are connected through floating gate 31. Floating gate 31 and program gate 32 corresponding to the programming region can be regarded as forming a tunnel diode. Programming is performed by a tunnelling mechanism through the tunnel diode.

As discussed above, the prior art does not use program gate 32, and performs both programming and verification through drain 36 and channel area 37 of transistor 34. In that respect, the present invention is distinctive from the prior art.

Hereinafter, a double or multi-level programming method using the nonvolatile memory of FIGS. 3A and 3B will be described. The programming method of the present invention includes voltage detection and current detection.

Figure 4:
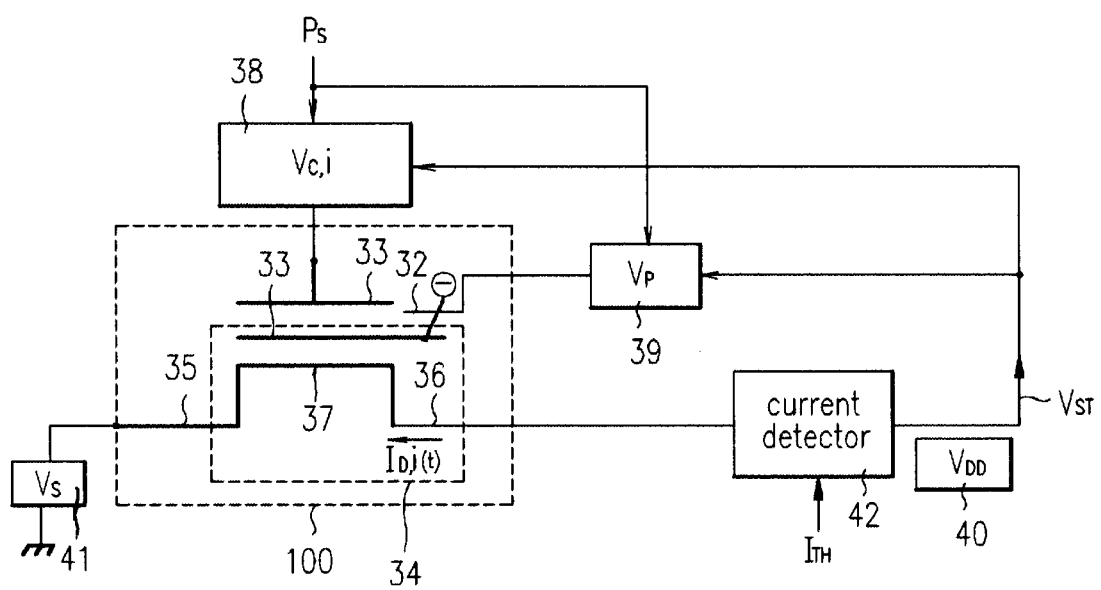
FIG. 4 is a diagram explaining a programming method using current detection according to the first embodiment of the present invention.

First, the current detection will be explained. FIG. 4 includes a first voltage source 38, second voltage source 39, third voltage source 40, fourth voltage source 41, current detector 42, and nonvolatile memory 100 such as that shown in FIG. 3. Reference character $P_s$ indicates an externally supplied programming start signal. Reference character $V_{ST}$ indicates a programming stop signal.

First voltage source 38 supplies a voltage $V_{c,i}$ (i=0, 1, 2, ... n−1) to control gate 33 of nonvolatile memory 100 for the purpose of programming an ith threshold level during multi-level programming. Voltage $V_{c,i}$ has values that vary with the respective programming levels.

Second voltage source 39 applies a voltage $V_P$ to program gate 32 for the double or multi-level programming. Voltage $V_P$ always has a fixed negative value.

Third voltage source 40 induces a voltage $V_D$ to drain 36 in order to monitor the state of programming, that is, drain current $I_{D,i}(t)$, during the double or multi-level programming. Fourth voltage source 41 supplies a voltage $V_S$ to source 35. For example, voltage $V_S$ may be ground. $I_{D,i}(t)$ indicates the current flowing through drain 36 at time (t).

Current detector 42 has a threshold current value Ith, and produces a programming stop signal $V_{ST}$ when current $I_{D,i}(t)$ flowing through drain 36 reaches the threshold current Ith during an ith threshold level programming. In other words, programming stop signal $V_{ST}$ is generated when $I_{D,i}(t) \leq$ Ith (at t=$t_{p,i}$). Time $t_{p,i}$ refers to the time when the ith threshold programming is completed. Here, threshold current Ith of current detector 42 can be defined by a value near the threshold region of the transistor, which can be greater than or equal to zero.

An arbitrary reference current $I_{REF}$ greater than the threshold current can also be used for describing the present invention, resulting in the same conclusion. However, if reference current $I_{REF}$ is large, the initial voltage at floating gate 31 $V_{F,i}(0)$ should be large as well, so as to satisfy $I_{D,i}(0)>I_{REF}$ at the initial stage of the multi-level programming. In addition, in order to increase the initial voltage $V_{F,i}(0)$, voltage $V_{c,i}$ must also be increased.

Current $I_{D,i}(t)$ indicates the current value of drain 36 triggered by voltage $V_{F,i}(t)$ at floating gate 31 during the ith level programming. The current value has the largest value at the initial stage of programming, and is reduced as programming proceeds. When the reduced value reaches threshold current Ith of current detector 42, the current detector produces program stop signal $V_{ST}$.

In accordance with the above-stated condition, double or multi-level programming using the detection of drain current will be described with reference to FIGS. 4, 5A–5I and 6. FIGS. 5A–5I show waveforms at the respective locations of FIG. 4. FIG. 6 is a flowchart illustrating double or multi-level programming of the present invention.

Presume that a corresponding cell is in the state of erasure. Here, the state of erasure means level zero, that is, the lowest level. This embodiment is described assuming that the floating gate field effect transistor has an n-type channel formed on a p-type substrate. Of course, a floating gate field effect transistor in which a p-type channel is formed on a n-type substrate can be also employed. In this case, if the applied voltages are set to opposite polarities, and the signs of corresponding voltages and threshold voltages are reversed, the same operations can be performed as in the former case.

Figure 5A:
Figure 6:
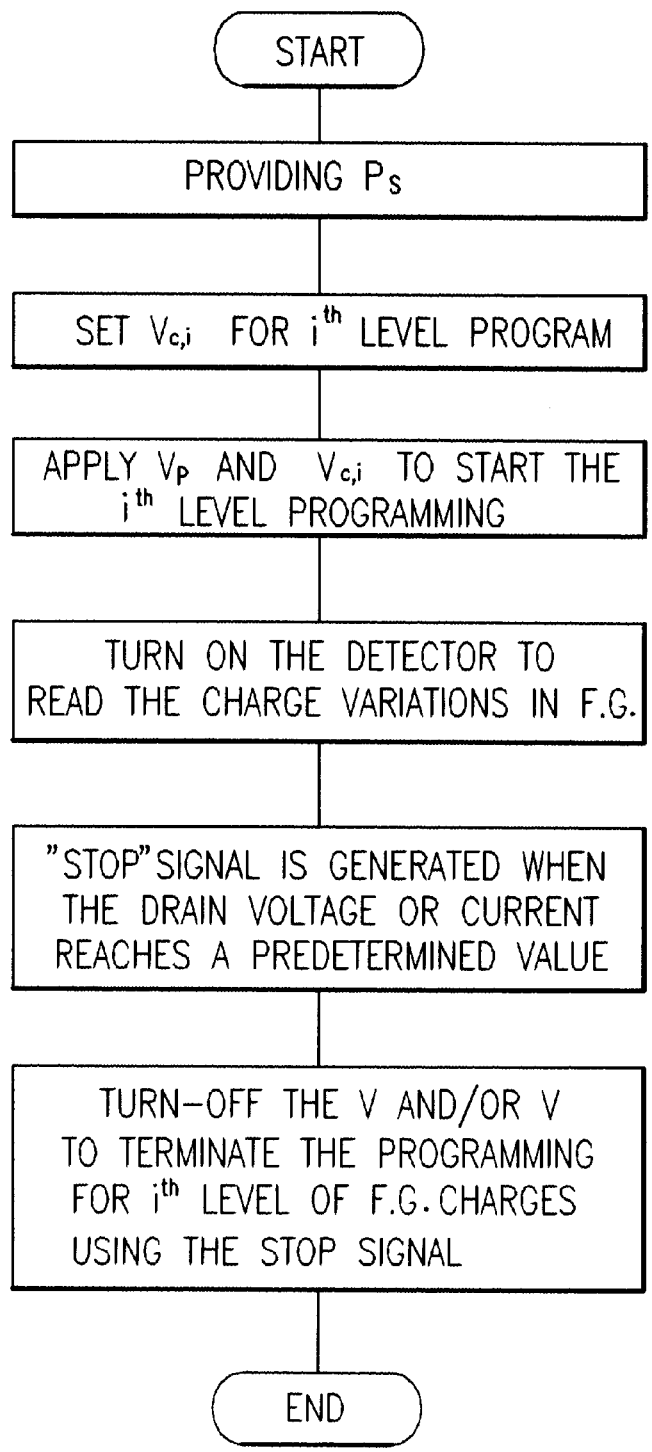
FIG. 6 is a flowchart of showing double or multi-level programming according to the first embodiment of the present invention.

First, when programming start signal $P_s$ is externally applied as shown in FIG. 5A for the purpose of double or multi-level programming, positive voltage $V_{C,i}$ is set for programming the ith level.

Figure 5B:
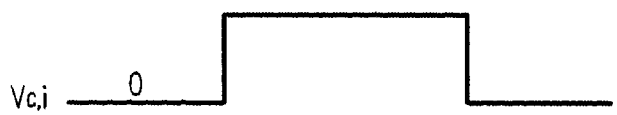
Figure 5C:

When programming start signal $P_S$ of FIG. 5A is applied, positive voltage $V_{C,i}$ of FIG. 5B and negative voltage $V_P$ of FIG. 5C are supplied to control gate 33 and program gate 32, respectively, from first and second voltage sources 38 and 39. Then, tunnelling voltage $V_{tun,i}(t)$ of FIG. 5G is applied between program gate 32 and floating gate 31 so that charges for the ith threshold level programming are supplied to floating gate 31 from program gate 32. After $V_{C,i}$ and $V_P$ is applied, current detector 42 is turned-on in order to verify the charge variation at floating gate 31.

Figure 5D:
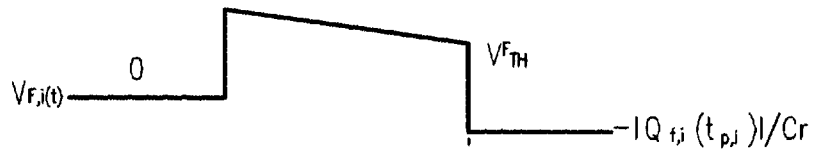

As shown in FIG. 5D, voltage $V_{F,i}(t)$ for the ith threshold level programming is applied to floating gate 31, and an inversion layer is formed in channel area 37 of field effect transistor 34. Because source 35, drain 36, and channel area 37 are located within a semiconductor substrate, when the inversion layer is formed, currents flow from drain 36 to source 35 through channel area 37. Voltages are supplied from third and fourth voltage sources 40 and 41 so that drain voltage $V_D$ and source voltage $V_S$ are induced to drain 36 and source 35, respectively. Here, current $I_{D,i}(t)$ flows through drain 36. As shown in FIG. 5E, current $I_{D,i}(t)$ has its largest value at an initial stage, and decreases as programming proceeds because the electrons are injected to the floating gate to reduce the floating gate voltage.

Figure 5F:
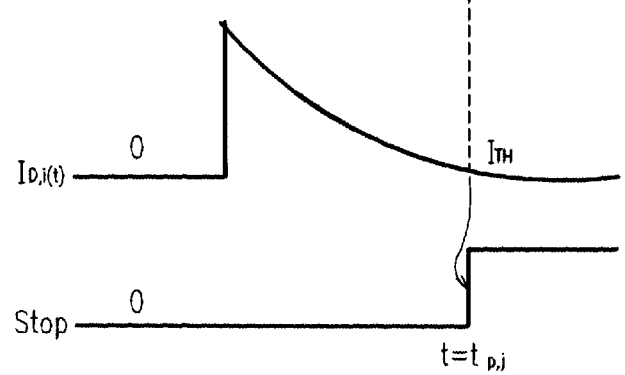
Figure 5G:

During the ith threshold level programming, current detector 42 monitors drain current $I_{D,i}(t)$. When this value reaches threshold current Ith, as shown in FIG. 5E, the ith threshold level programming is completed and programming stop signal $V_{ST}$ is output, as shown in FIG. 5F. Here, it was explained that current detector 42 monitors current $I_{D,i}(t)$ at drain 36. However, it is also possible to say that the current detector 42 monitors the variation of the amount of voltage and charge at floating gate 31 during programming of FIG. 5D. Monitoring of current $I_{D,i}(t)$ can be regarded as monitoring the conductivity of the inversion layer formed in channel area 37.

In FIG. 4, programming stop signal $V_{ST}$ is applied to first and second voltage sources 38 and 39. First and/or second voltage sources 38 and 39 stop supplying positive voltage $V_{C,i}$ and negative voltage $V_P$ to control gate 33 and program gate 32 in response to programming stop signal $V_{ST}$, as shown in FIGS. 5B and 5C. When current $I_{D,i}(t)$ is detected to become below threshold current Ith at a point where $t=t_{P,i}$ the ith threshold level programming is completed. Time $t_{P,i}$ indicates when the ith threshold level is programmed. Here, threshold current Ith is previously set as a value substantially corresponding to threshold voltage $V^F_{TH}$ at floating gate 31. Threshold voltage $V^F_{TH}$ at the floating gate is determined when the nonvolatile memory is fabricated, and can be defined at an arbitrary value of the threshold current Ith.

In other words, in FIG. 3, because field effect transistor 34 is formed with floating gate 31, source 35, and drain 36, threshold voltage $V^F_{TH}$ substantially corresponds to the threshold voltage of channel area 37. Here, it must be noted that the programming of any threshold level is completed when the floating gate voltage reaches threshold voltage $V^F_{TH}$. This is one feature that distinguishes the present invention from conventional technologies.

Figure 5H:
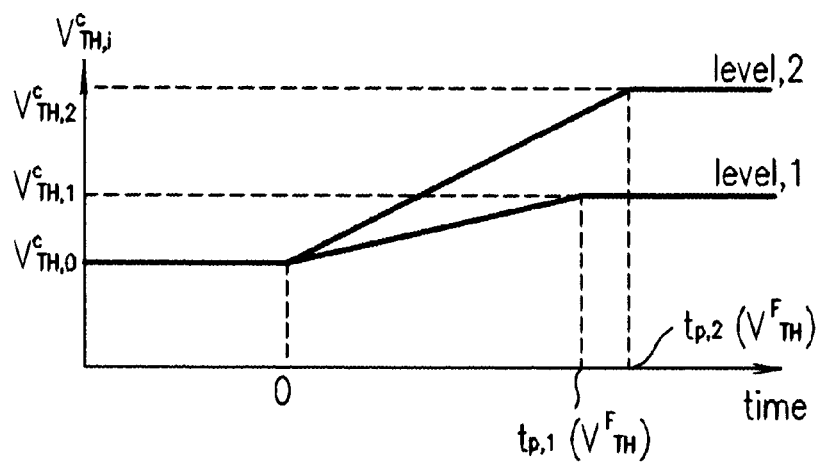

FIG. 5H is a graph showing threshold voltages $V^C_{TH,1}$ and $V^C_{TH,2}$ at control gate 33, corresponding to the first and second threshold levels, respectively. In FIG. 5H, threshold voltage $V^C_{TH,1}$ at control gate 33 increases as the programming level increases during the multi-level programming. This is performed by increasing voltage $V_{C,1}$ during programming. Here, program times $t_{p,1}$ and $t_{p,2}$ of the first and second levels are different because the control gate voltage and threshold voltage shift of the respective levels are different.

Figure 5I:
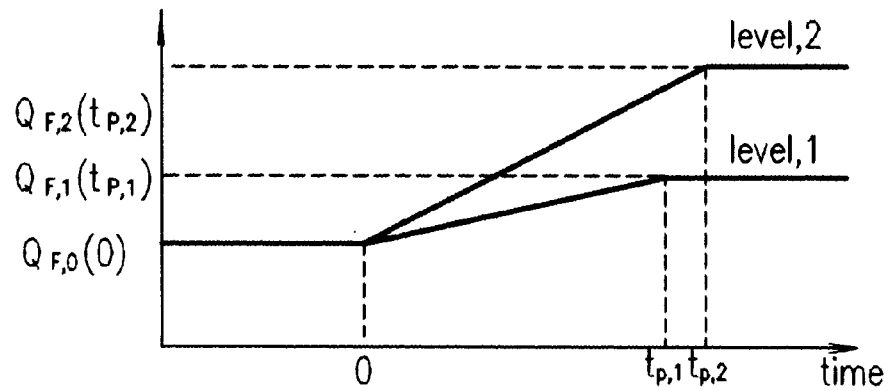

Meanwhile, FIG. 5I is a graph showing the amount of charge variation at floating gate 31 from the initial charge amount $Q_{F,0}(0)$ to the charge amount $Q_{F,1}(t_{P,1})$ when the first threshold level programming is completed and to the charge amount $Q_{F,2}(t_{P,2})$ when the second threshold level programming is completed, in the case where the ith threshold levels corresponds to the first and second levels. In FIG. 5I, it is noted that when voltages $V_{F,1}(t_{P,2})$ and $V_{F,2}(t)$ at floating gate 31 reach threshold voltage $V^F_{TH}$ ($t=t_{p,1}$, $t=t_{p,2}$), the charge amount at floating gate 31 is increased from the initial amount $Q_{F,0}(0)$ to amount $Q_{F,1}(t_{p,1})$ and to amount $Q_{F,2}(t_{P,2})$.

Figure 7A:
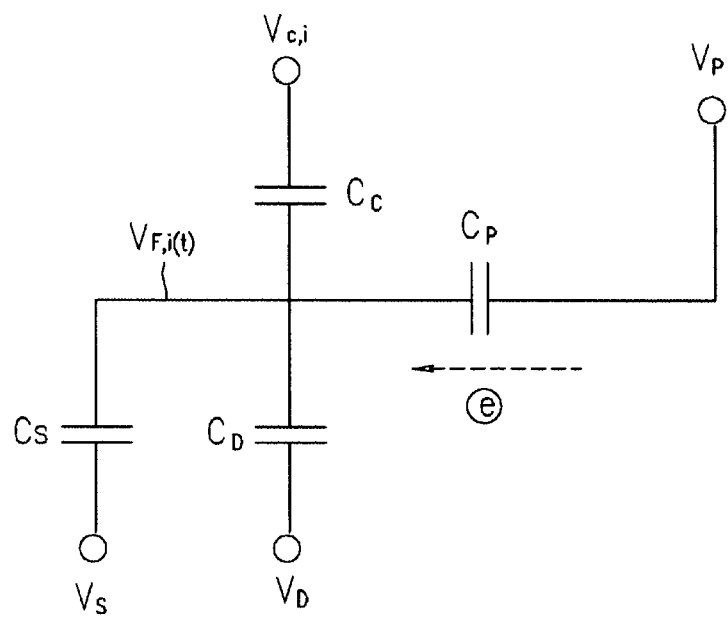
FIG. 7A is an equivalent circuit diagram of the capacitances of the nonvolatile memory of FIG. 3B.

Referring to FIG. 7A, the relationship between voltage $V_{C,i}$ applied to control gate 32 from first voltage source 38 and the threshold voltage at a corresponding level, which is a significant result of the present invention, will be explained. In FIG. 7A, $C_C$ represents the capacitance between control gate 32 and floating gate 31, $C_P$ represents the capacitance between program gate 32 and floating gate 31, $C_D$ represents the capacitance between drain 36 and floating gate 31, and $C_S$ represents the capacitance between source 35 (including the substrate) and floating gate 31.

Sum $C_T$ of those capacitances can be expressed by the following equation (1):

$$C_T = C_C + C_P + C_D + C_S \qquad (1)$$

The coupling coefficients of the respective capacitances are defined by the following equations (2):

$$\alpha_C = C_C/C_T, \ \alpha_P = C_P/C_T, \text{ and } \alpha_D = C_D/C_T \quad (2)$$

In FIG. 7A, voltage at floating gate 31 during programming can be expressed by the following equation (3):

$$V_F(t) = \alpha_C V_C + \alpha_P V_P + \alpha_D V_D(t) + Q_F(t)/C_T \quad (3)$$

$$= \alpha_C[V_C - V^C_{TH}(t)] + \alpha_P V_P + \alpha_D V_D(t)$$

where $Q_F(t)$ indicates the charge amount at floating gate 31. In the equation (3), it is assumed that the source and substrate are grounded.

In programming, threshold voltage $V^C_{TH}(t)$ at control gate 33 is defined by the following equation (4):

$$V^C_{TH}(t) = -\frac{Q_F(t)}{C_C} \quad (4)$$

In other words, in equation (4), $V^C_{TH}(t)$ indicates a threshold voltage shift measured at control gate 33 at time t. The threshold voltage shift refers to a threshold voltage measured at the control gate and caused by the charges accumulated at the floating gate.

Threshold voltage $V^C_{TH}(t)$ measured at control gate 33 is defined as the voltage of control gate 33 when drain current $I_D(t)$ reaches threshold current Ith of current detector 42. Threshold current Ith can be defined arbitrarily as mentioned above. For instance, Ith can equal 1 μA.

Threshold voltage $V^F_{TH}$ at floating gate 31 is an inherent threshold voltage of the field effect transistor consisting of floating gate 31, source 35, and drain 36 of FIG. 3, which is determined by manufacturing conditions such as channel ion implantation and the thickness of a gate insulator in fabricating nonvolatile memory 100 of FIG. 3. Therefore, threshold voltage $V^F_{TH}$ of floating gate 31 is always constant. Threshold voltage $V^C_{TH}$ of control gate 33 is determined by the amount of charge $Q_F$ at floating gate 31.

As described above, programming at respective levels is stopped when voltage $V_F(t)$ at floating gate 31 is decreased until threshold voltage $V^F_{TH}$ is reached. This time point corresponds to when current $I_D(t)$ of drain 36 reaches threshold current Ith and time $t_P$ when programming is completed. During the respective threshold level programmings, voltage $V_F(t_P)$ of floating gate 31 when programming is finished can be expressed by the following equation (5):

$$V_F(t_P) = V^F_{TH} = \alpha_C[V_C - V^C_{TH}(t_P)] + \alpha_P V_P + \alpha_D V_D(t_P) \quad (5)$$

To rearrange equation (5) according to voltage $V_C$ applied to control gate 33 from first voltage source 38, the following equation (6) is given:

$$V_C = V^C_{TH}(t_P) + \frac{V^F_{TH} - \alpha_P V_P - \alpha_D V_D(t_P)}{\alpha_C} \quad (6)$$

$$= V^C_{TH}(t_P) + V_1$$

where $V_1$ is defined:

$$V_1 = \frac{V^F_{TH} - \alpha_P V_P - \alpha_D V_D(t_P)}{\alpha_C}$$

Here, it is important that value $V_1$, when detection time point $t=t_P$, is a constant with respect to control gate voltage $V_{C,i}$ at the respective levels.

Value $V_1$ is determined by drain voltage $V_D(t_P)$ when $t=t_P$, voltage $V_P$ applied to program gate 32, and parameters such as $V^F_{TH}$, $\alpha_C$, $\alpha_D$ and $\alpha_P$ which are determined during the manufacturing process. The circuit can be constructed so that drain voltage $V_D$ becomes a constant value. Values $\alpha_D$ and $V_D$ are relatively very small with respect to the other two terms. In the respective threshold level programming, $V_D(t_P)$ at the completion of programming (when $t=t_P$) is constant.

Using equation (6), voltage $V_{C,i}$ of control gate 33 required for the ith threshold level programming can be expressed as the following equation (7):

$$V_{C,i} = V^C_{TH,i} + V_1 \quad (7)$$

where i=0, 1, 2, 3, . . . ,n-1.

Figure 7B:
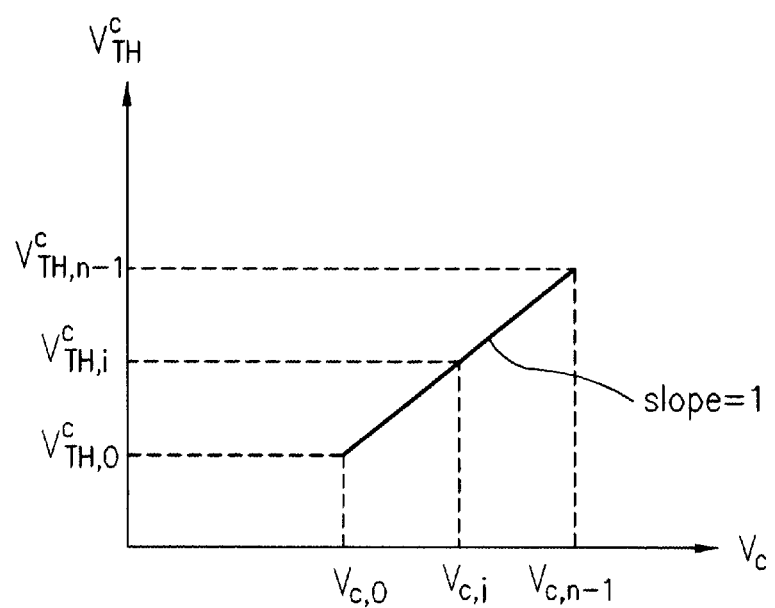
FIG. 7B is a graph showing the relationship between the threshold levels to be programmed and the correspondingly applied voltages of the control gate.

From this equation, it is found that threshold levels to be programmed and correspondingly applied control gate voltages are linear with a slope of 1. FIG. 7B shows this result. Here, likewise, according to equation (4), the charge amount of the floating gate is linear with the control gate voltages.

Because value $V_1$ is constant as mentioned above, the ith shift $\Delta V_{C,i}$ of the voltage applied to control gate 33 during the multi-level programming can be given as the following equation (8):

$$\Delta V_{C,i} = \Delta V^C_{TH,i} \quad (8)$$

From equations (7) and (8), when shift $\Delta V^C_{TH,i}$ from the state of erasure (i.e., the lowest level) to one of the respective threshold levels is determined during the double or multi-level programming, a corresponding level programming can be performed by applying to the control gate a voltage corresponding to the intended threshold level shift $\Delta V^C_{TH,i}$ added to the already known value $V_{C,0}$ of the lowest level programming, and then waiting for the automatic completion of programming.

As shown in FIG. 5G, during the respective level programming, tunnelling voltage $V_{tun,i}$ applied between floating gate 31 and program gate 32 for tunnelling is largest initially and smallest at a time point when voltage $V_{F,i}(t)$ reaches a given threshold voltage $V^F_{TH}$ at floating gate 31, that is, when programming is completed.

The maximum $V^{max}_{tun,i}$ of the tunnelling voltage can be given as the following equation (9) by the difference between initial voltage $V_{F,i}(0)$ of floating gate 31 and voltage $V_P$ applied to program gate 32:

$$V^{max}_{tun,i} = V_{F,i}(0) - V_P \quad \text{(actually negative value)} \quad (9)$$

$$= \alpha_C V_{C,i} + (\alpha_P - 1)V_P + \alpha_D V_D(0) + \frac{Q_F(0)}{C_T}$$

In equation (9), if the initial charge amount $Q_F(0)$ of floating gate 31 is zero, equation (9) can be re-defined as the following equation (10):

$$V^{max}_{tun,i} = \alpha_C V_{C,i} + (\alpha_P - 1)V_P + \alpha_D V_D(0) \quad (10)$$

Hereinbefore, multi-level programming has been described. An erasing process using the nonvolatile memory of FIG. 3 will be explained below.

The erasing process is very simple to describe. Erasure is performed in such a manner that voltages are applied to the respective parts to form, between the floating gate and source, drain, or channel area, electric fields strong enough to erase charge carriers accumulated at the floating gate. By doing so, the charge carriers are erased to the source, drain, or channel area through tunnelling. In the present invention, the erased state means the lowest threshold level, that is, $V^C_{TH,0}$. In other words, all the nonvolatile memory cells within a given erasure block are programmed at the lowest level. Erasure is performed according to the following steps.

First, threshold levels of the overall cells of a selected block are erased to become below level zero, that is, $V^C_{TH,0}$. Sequentially, with the level zero in which the voltage of control gate 33 is $V_{C,0}$, the overall selected cells are programmed. Here, value $V_{C,0}$ can be fixed arbitrarily. Erasure is performed substantially according to the programming method, thereby eliminating over-erasure problem. Finally, the requirements of voltage $V_{C,i}$ of control gate 33 and voltage $V_P$ of program gate 32 necessary for the ith threshold level programming are as follows.

In order to monitor the charge variation of the floating gate during programming, voltage $V_{C,i}$ must be applied so that at the initial stage of programming, the channel of transistor shown in FIG. 4 is inverted to make the drain current flow, and during the programming, the conductivity of the inversion layer is reduced. For this purpose, the following equation (11) must be satisfied.

$$V_{F,i}(0) > V^F_{TH}, I_{D,i}(0) > \text{Ith} \tag{11}$$

Values $V_{C,i}$ and $V_P$ must be determined so that a tunnel electric field formed between program gate 32 and floating gate 31 to create tunnelling therebetween is strong enough for programming.

Value $V_P$ is a fixed negative value so that the strength of the tunnel electric field increases as value $V_{C,i}$ becomes high. The speed of programming also increases as threshold voltage shift $\Delta V^C_{TH}$ of control gate 33 becomes large. Thus, a programming method in accordance with current detection has been described.

Hereinafter, a programming method in accordance with voltage detection will be explained with reference to FIG. 8. The programming method in accordance with voltage detection is substantially the same as the programming in accordance with current detection.

Figure 8A:
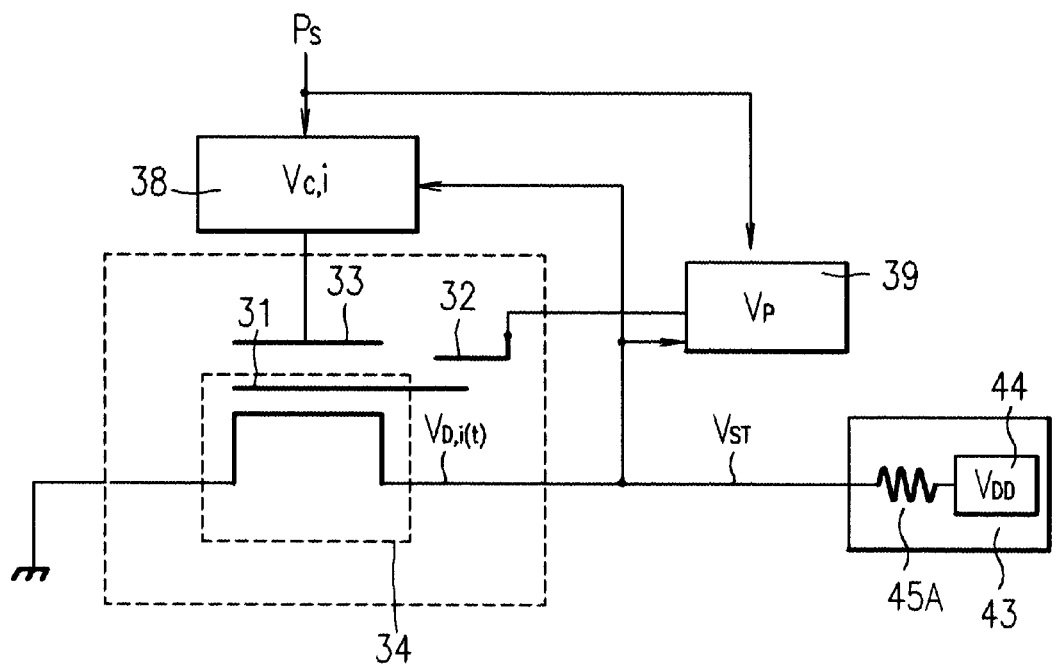
FIG. 8A is a diagram explaining a programming procedure of the present invention, using voltage detection according to the first embodiment of the present invention.
Figure 8B:
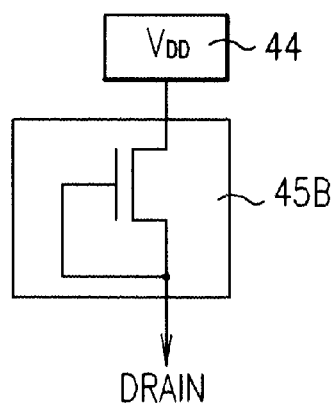
FIG. 8B is a circuit diagram of another embodiment of the voltage detecting portion of FIG. 8A.

FIG. 8 is a diagram for explaining the programming of the present invention using voltage detection. FIG. 8 is substantially the same as FIG. 4, aside from voltage detector 43 used instead of current detector 42 of FIG. 4.

Voltage detector 43 can be made with a reference voltage source 44 and a resistor 45 connected between reference voltage source 44 and drain 36. The resistor 45 may be replace by a diode to form the voltage detector 43. This is the most simple configuration. Voltage detector 43 monitors the voltage of drain 36 during programming. During monitoring, when voltage $V_{F,i}$ of floating gate 31 reaches a threshold voltage $V^F_{TH}$ and if drain voltage $V_{D,TH}$ is detected, then a programming stop signal $V_{ST}$ is output. Value $V_{D,TH}$ is constant with respect to the overall programming level.

Like the current detection method, programming is completed when, in response to programming stop signal $V_{ST}$ first and/or second voltage sources 38 and 39 cut off control gate voltage $V_{C,i}$ and program gate voltage $V_P$.

Other parts are also substantially the same as the current detection, and their description will be omitted.

Referring to FIGS. 9A and 9B, a first structure of a nonvolatile memory of the present invention comprises a first conductivity-type semiconductor substrate 50 having a channel area on its surface, floating gate 51 formed on the channel area, control gate 52 formed above floating gate 51, program gate 53 formed adjacent to floating gate 51, and an insulating layer 54 formed between program gate 53, floating gate 51, and control gate 52. The insulating layer 54 is sufficiently thin between floating gate 51 and program gate 53 to enable tunnelling therebetween.

Referring to FIGS. 9A and 9B again, a field insulating layer 55 is formed on the surface of substrate 50 surrounding the channel area. Part of floating gate 51 extends to the surface of field insulating layer 55. In FIG. 9B, program gate 53 is placed adjacent to one side of control gate 52. A gate insulating layer 56 is formed sufficiently thin to enable tunnelling between the channel area and floating gate 51.

Figure 10A:
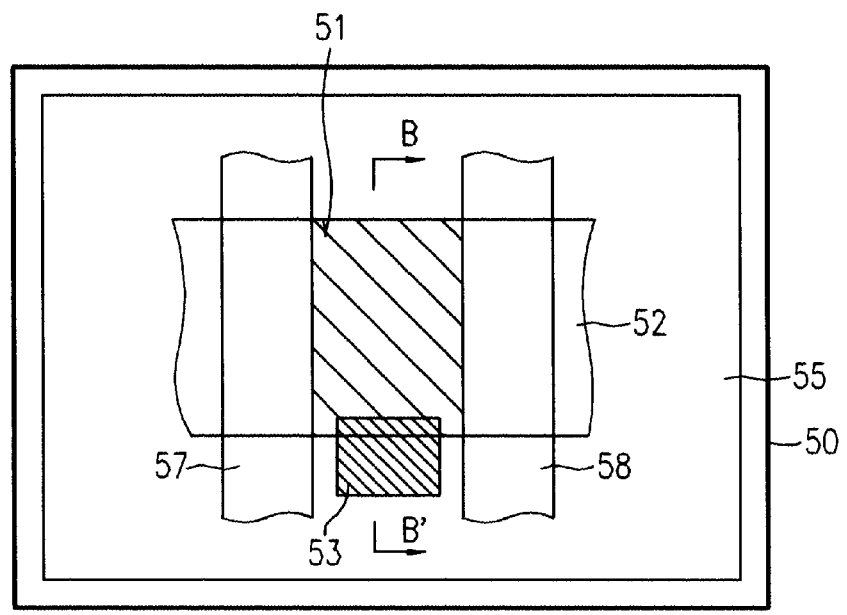
FIG. 10A is a layout of the second structure of the nonvolatile memory according to the first embodiment of the present invention.
Figure 10B:
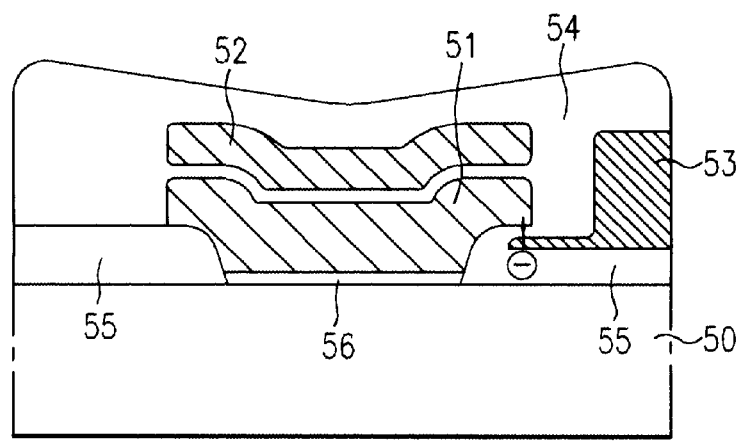
FIG. 10B is a cross-sectional view of the second structure of the nonvolatile memory cut along line B–B' of FIG. 10A.
Figure 11A:
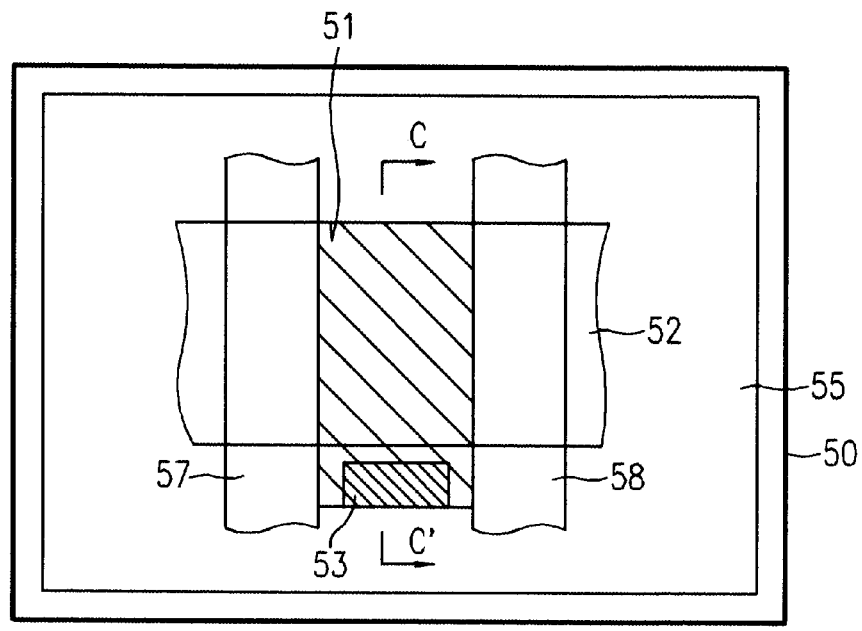
FIG. 11A is a layout of the third structure of the nonvolatile memory according to the first embodiment of the present invention.
Figure 11B:
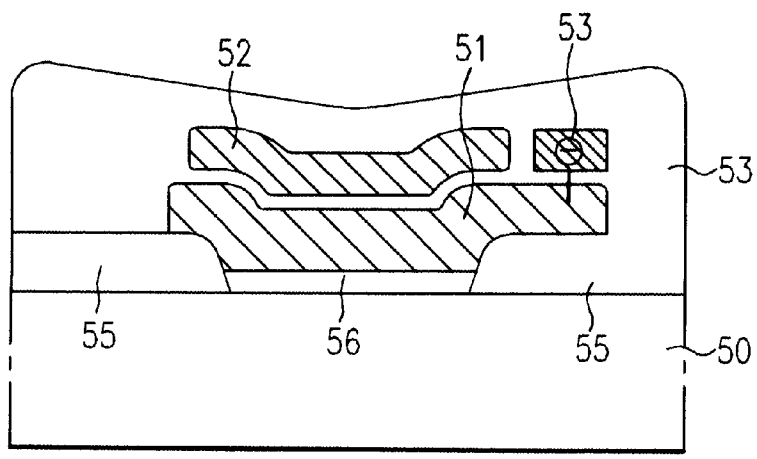
FIG. 11B is a cross-sectional view of the third structure of the nonvolatile memory cut along line C–C' of FIG. 11A.

Turning to FIGS. 10A and 10B, a second structure of the present invention is similar to that of the first structure. In this embodiment, part of program gate 53 is placed adjacent to the bottom of floating gate 51. Referring to FIGS. 11A and 11B, a third structure of the present invention again is similar to that of the first structure. In this third embodiment, program gate 53 is placed adjacent to the top of floating gate 51.

Figure 12A:
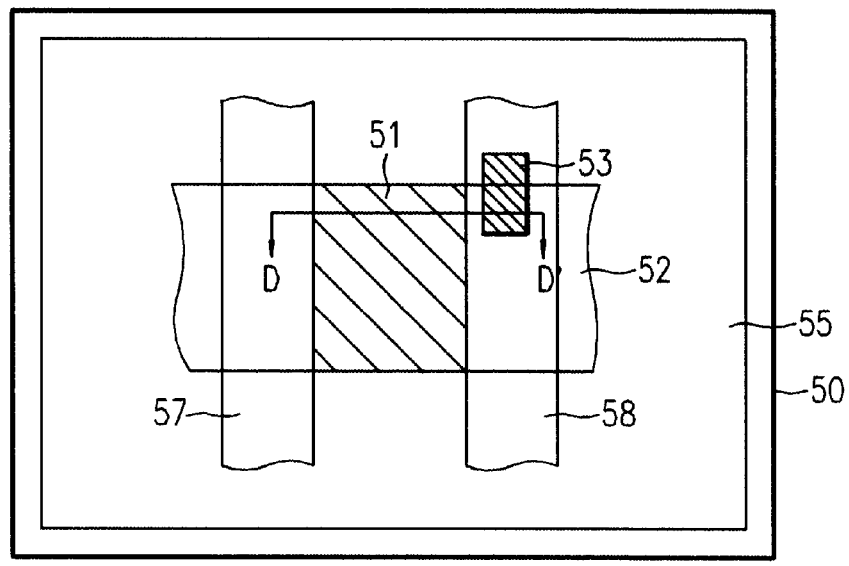
FIG. 12A is a layout of the fourth structure of the nonvolatile memory according to the first embodiment of the present invention.
Figure 12B:
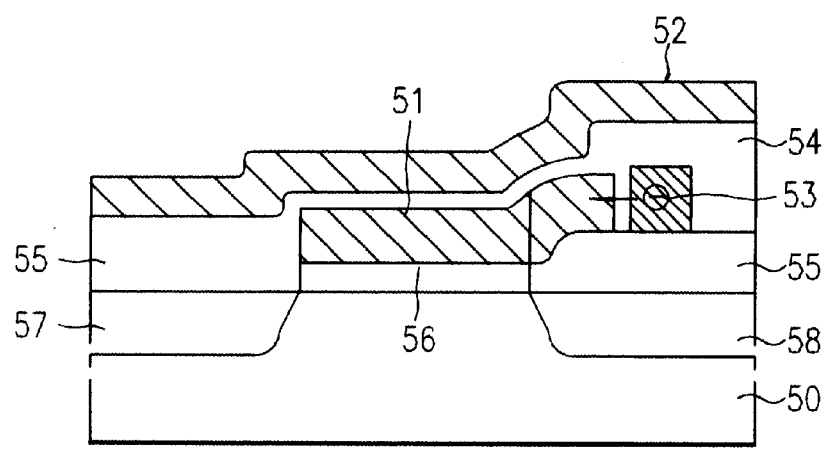
FIG. 12B is a cross-sectional view of the fourth structure of the nonvolatile memory cut along line D–D' of FIG. 12A.

Referring to FIGS. 12A and 12B, a fourth structure of nonvolatile memory of the present invention comprises a first conductivity-type semiconductor substrate 50 having a channel area on its surface, floating gate 51 formed on the channel area, two second conductivity-type impurity areas 57 and 58 formed on either side of the channel area within the surface of the semiconductor substrate, control gate 52 formed above floating gate 51, program gate 53 formed adjacent to floating gate 51, and an insulating layer 54 formed between program gate 53, floating gate 51, and control gate 52. The insulating layer 54 is sufficiently thin between floating gate 51 and program gate 53 to enable tunnelling therebetween. A field insulating layer 55 surrounds the channel region. A gate insulating film 56 is formed sufficiently thin to enable tunnelling between the channel area and the floating gate 51.

Referring to FIG. 13A, the nonvolatile memory device of the present invention comprises a semiconductor substrate 60, a plurality of word lines 61 spaced apart by a predetermined distance on substrate 60, a plurality of bit lines 62 perpendicular to the word lines to form a plurality of squares or rectangles spaced apart by a predetermined distance, a plurality of program lines 63 disposed in the same direction as the respective bit lines, and a plurality of nonvolatile memory cells 64 disposed in each of the respective squares or rectangles.

In FIG. 13A, as shown in FIG. 3, nonvolatile memory cells 64 each comprise a floating gate 65, program gate 66 for supplying charges to floating gate 65 for the purpose of programming, control gate 67 for controlling the amount of charges supplied to floating gate 65 for the purpose of programming, and field effect transistor 68 for reading (or verifying) the amount of charge carriers supplied to floating gate 65 during programming. Field effect transistor 68 is composed of floating gate 65, source 69, drain 70, and channel area 71 between source 69 and drain 70.

Control gate 67 of the respective memory cells is connected to nearby word line 61 and program gate 66 is connected to nearby program line 63. Source 69 of nonvolatile memory cell 64 is commonly connected to nearby bit line 62 along with drain 70 of nonvolatile memory cell 64 placed in a nearby or adjacent square.

As shown in FIG. 13B, when the nonvolatile memory device operates in a program mode, ⁻8–15 V is applied to a selected program line 63, 0 V to unselected program lines 63, 3–12 V to a selected word line 61, 0–10 V to unselected word lines 61, 0.5–2 V to a selected bit line 62, 0 V to unselected bit lines 62 placed to the left, for example, of a selected cell, 0.5–2 V to more than one bit line placed to the right, for example, of the selected cell, and 0 V to substrate 60.

When the nonvolatile memory device operates in the erase mode, there are two ways to apply voltages.

First, to erase through bit lines 62, 0–$^{-12}$ V is applied to the overall program lines 63 of a selected erasure block, ⁻7–⁻12 V to the overall word lines 61 of the selected erasure block, 0–6 V to the overall bit lines 61 of the selected erasure block, and 0 V to substrate 60.

To erase through substrate 60, 0–$^{-12}$ V is applied to the overall program lines 63 of a selected erasure block, ⁻7–⁻12 V to the overall word lines 61 of the selected erasure block. Bit lines 62 of the selected block are floated. 0–6 V is applied to substrate 60.

When the nonvolatile memory device operates in a read mode, 0 V is applied to program lines 63, Power supply voltage Vcc to a selected word line 61, 0 V to unselected word lines 61, 0.5–2 V to a selected bit line 62, 0 V to unselected bit lines 62 placed to the left, for example, 0.5–2 V to bit lines 62 placed right, for example, of the selected cell, and 0 V to substrate 60.

The voltages of FIG. 13B can be varied with structural characteristics or electrical parameters of the memory cells, for instance, the coupling coefficient or the thickness of tunnel insulator.

Second Embodiment

Hereinafter, there will be described the second embodiment of nonvolatile memory cell and device of the present invention, and a method of programming, with reference to FIGS. 14, 15A, 15B, 16A, 16B, 17A, and 17B.

Referring to FIG. 14, the nonvolatile memory comprises a floating gate 81 divided into a first area 81a and a second area 81b; a programming field effect transistor including first area 81a of floating gate 81, first drain 82, and common source 83, channel region between the first drain 82 and the common source 83 and having a first threshold voltage $V^F_{TH1}$ for supplying charge carriers to floating gate 81 for the purpose of programming; a control gate 84 for providing voltage to floating gate by capacitive coupling between floating gate and control gate and controlling the amount of charge carriers supplied to floating gate 81 for programming; and a monitoring field effect transistor including second area 81b of floating gate 81 (excluding first area 81a), second drain 85, and common source 83, channel region between the second drain 85 and the common source 83 and having a second threshold voltage $V^F_{TH2}$ for verifying the amount of charge carriers supplied to floating gate 81 during programming. In the circuit of FIG. 14, second threshold voltage $V^F_{TH2}$ must be greater than first threshold voltage $V^F_{TH1}$.

As shown in FIG. 14, unlike the first embodiment, the second embodiment of nonvolatile memory cell of the present invention does not have a program gate, and instead has three impurity areas (the drain of the monitoring transistor, common source, and the drain of the programming transistor) on the surface of the substrate.

Besides the components of FIG. 14, the memory of FIG. 15A further comprises a first voltage source 88 for supplying a voltage to control gate 84, a second voltage source 89 for supplying a voltage $V^P_D$ to first drain 82 of the programming field effect transistor for programming, a third voltage source 90 for supplying to common source 83 a voltage $V_s$ lower than or equal to voltage $V^P_D$ supplied to first drain 82, and a current detector 91A for detecting current $I_{D,i}(t)$ flowing through second drain 85 of the monitoring field effect transistor during programming and supplying programming stop signal $V_{ST}$ to respective voltage sources 88, 89 and 90 when the detected current reaches a set threshold current Ith to cut off voltages $V_{C,i}$, $V^P_D$, and $V_S$. In FIG. 15A, common source 83 is grounded with the substrate (not shown).

In FIG. 15A, voltage $V_{C,i}$ supplied to control gate 84 from first voltage source 88 is a positive voltage varying in correspondence with the respective threshold level programming of the multi-level programming. Voltage $V^P_D$ supplied to the programming field effect transistor from second voltage source 89 is a positive voltage. Current detector 91A of FIG. 15A can be replaced with voltage detector 91B of FIG. 15B.

Referring to FIG. 15B, besides the components of FIG. 14, the nonvolatile memory cell further comprises a first voltage source 88 for supplying a voltage $V_{C,i}$ to control gate 84, a second voltage source 89 for supplying a voltage $V^P_D$ to first drain 82 of the programming field effect transistor for programming, a third voltage source 90 for supplying to common source 83 a voltage $V_S$ lower than or equal to voltage $V^P_D$ supplied to first drain 82, and a voltage detector 91B for monitoring voltage $V^M_{D,i}(t)$ during programming and supplying programming stop signal $V_{ST}$ to the first and second voltage sources 88 and 89 when the monitored voltage $V^M_{D,i}(t)$ of second drain 85 reaches a set reference voltage $V_{D,TH}$ to cut off voltages $V_{C,i}$ and $V^P_D$.

Even when voltage detector 91B of FIG. 15B is used instead of current detector 91A of FIG. 15A, voltage $V_{C,i}$ supplied to control gate 84 from first voltage source 88 is a positive voltage varying in correspondence with the respective threshold level programming of the multi-level programming. Voltage $V^P_D$ supplied to first drain 82 of the programming field effect transistor from second voltage source 89 is a positive voltage in case of programming using hot carrier injection mechanism. As shown in FIG. 15B, voltage detector 91B can be configured with a voltage source $V_{DD}$ for inducing a voltage at second drain 85, and a resistor connected between voltage source $V_{DD}$ and second drain 85 of the monitoring field effect transistor.

Voltage $V_P$ is set to be less than or equal to zero ($\leq 0$) and is supplied to the program gate of the first embodiment shown in FIGS. 3B and 4. However, the cell of the second embodiment shown in FIGS. 15A and 15B uses a programming field effect transistor instead of the program gate.

In a nonvolatile memory cell comprising a control gate 84, a floating gate divided into first and second areas 81a and 81b, a programming field effect transistor having a first threshold voltage $V^F_{TH1}$ and including first area 81a of floating gate 81, first drain 82, common source 83, and a first channel area 86 located between first drain 82 and common source 83, and a monitoring field effect transistor having a second threshold voltage $V^F_{TH2}$ and including second area 81b of floating gate 81, second drain 85, common source 83, and a second channel area 87 placed between second drain 85 and common source 83, a method of programming the second embodiment of the nonvolatile memory cell of the present invention includes the steps of: supplying first voltage $V_{C,i}$ to control gate 84 and second voltage $V^P_D$ to first drain 82 so that charge carriers are fed to floating gate 81 through first channel area 86 for programming and an inversion layer is formed in second channel area 87; and monitoring the conductivity of the inversion layer during programming and cutting off the supply of first voltage $V_{C,i}$ to control gate 84 and/or second voltage $V^P_D$, to first drain 82 when the monitored conductivity reaches a reference value.

In FIGS. 14, 15A and 15B, supplying charge carriers to floating gate 81 from first channel area 86 for programming can be performed through hot carrier injection or Fowler-Norheim (FN) tunnelling. In case of programming using the tunnelling mechanism, the voltage applied to the first drain is less than or equal to zero, and the voltage applied to the common source is equal to that or the first drain.

Figure 16A:
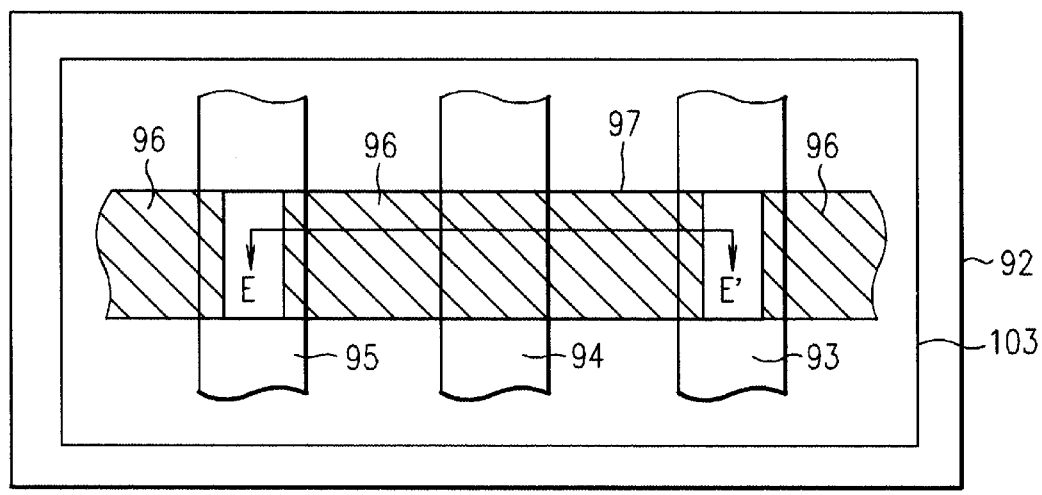
FIG. 16A is a layout of one structure of the nonvolatile memory according to the second embodiment of the present invention.
Figure 16B:
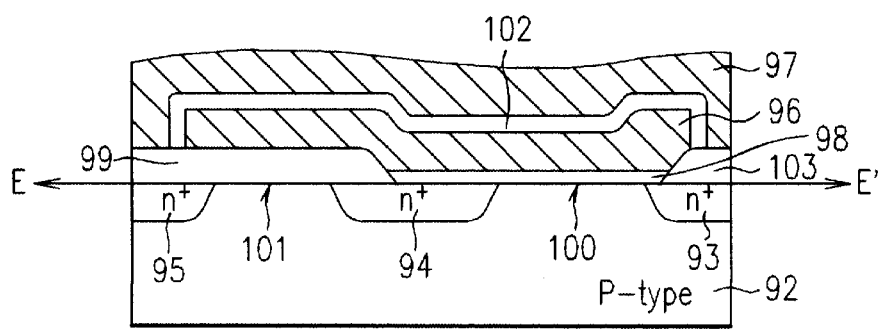
FIG. 16B is a cross-sectional view of one structure of the nonvolatile memory cut along line E–E' of FIG. 16A.

Referring to FIGS. 16A and 16B, the nonvolatile memory cell comprises a-first conductivity-type (P type) semiconductor substrate 92, a second conductivity-type (n+) first impurity area 93, second impurity area 94, and third impurity area 95 sequentially formed on the surface of substrate 92 while spaced apart by a predetermined distance, a first gate insulating layer 98 formed over first and second impurity areas 93 and 94 on substrate 92, a second gate insulating layer 99 formed over second impurity area 94 and third impurity area 95 and having a different thickness from that of first gate insulating layer 98, a first channel area 100 defined as a region between first and second impurity areas 93 and 94 on the surface of substrate 92, a second channel area 101 defined as a region between second and third impurity areas 94 and 95 on the surface of substrate 92, a floating gate 96 formed over first and third impurity areas 93 and 95 on first and second gate insulating layers 98 and 99, a control gate 97 formed above floating gate 96, and an insulating layer 102 formed to insulate floating gate 96 from control gate 97.

Here, as shown in FIG. 16B, second gate insulating layer 99 is thicker than first gate insulating layer 98. First gate insulating layer 98 is determined to be sufficiently thin so that charge carriers are erased to first channel area 100 from floating gate 96 through tunnelling.

While not described in detail in FIGS. 16A and 16B, a field insulating layer 103 is further formed on the surface of substrate 92 excluding first gate insulating layer 98 and second gate insulating layer 99. In FIGS. 16A and 16B, floating gate 96 is formed over first and second channel areas 100 and 101. Part of floating gate 96 extends to the surface of field insulating layer 103.

Referring to FIG. 17A, the nonvolatile memory device of the present invention comprises a plurality of word lines 104 disposed to be spaced apart by a predetermined distance, a plurality of second conductivity-type bit lines 105 disposed to be perpendicular to word lines 104 to form a plurality of squares or rectangles spaced apart by a predetermined distance, common source lines 106 formed to divide the respective squares or rectangles in the same direction as bit lines 105 into the left and right areas between bit lines 105, and a plurality of nonvolatile memory cells having a control gate 84, a floating gate 81 divided into, first and second areas 81a and 81b, a programming field effect transistor placed to the right of the squares, for example, and for supplying charge carriers to floating gate 81 for programming, and a monitoring field effect transistor placed to the left of the squares, for example, and for verifying the amount of charge carriers of floating gate 81 during programming. The programming field effect transistor includes first area 81a of floating gate 81, a first drain 82, and common source 83, and a first channel area 86 placed between first drain 82 and common source 83. The monitoring field effect transistor includes second area 81b of floating gate 81, a second drain 85, and common source 83, and a second channel area 87 placed between second drain 85 and common source 83. The control gate 84 is connected to nearby word line 104, and the common source 83 is connected to common source line 106. The first drain 82 is connected to nearby bit line 105 together with second drain 85 of the nonvolatile memory located in a square to the right of the first drain, for example, and the second drain 85 is connected to first drain 82 of the nonvolatile memory located in a square to the left of the second drain 85, for example.

When the nonvolatile memory device of FIG. 17A operates in the program mode using the hot carrier injection mechanism. As shown in FIG. 17B, 6–13 V can be applied to a selected word line, 0 V to unselected word line, 5–9 V to a selected $n^{th}$ bit line, 0.5–2 V to a selected $(n-1)^{th}$ bit lines, 0 V to other bit lines, 0 V to a selected $n^{th}$ source line, an unselected $(n+1)^{th}$ source line is floated, an unselected $(n-1)^{th}$ source line is equal to a selected (n-1) th bit line, and 0 V to the substrate. When the nonvolatile memory device operates in a program mode using tunneling mechanism, 10–20 V is applied to a selected word line, 0 V to an unselected word line, 0 V to a selected $n^{th}$ bit line, 5–10 V to other bit lines, 0 V to a selected $n^{TH}$ source line, 5–10 V to other source lines, and 0 V to substrate.

When the nonvolatile memory device of FIG. 17A operates in the erasure mode, −7 to −12 V can be applied to a selected word line and an unselected word line, all bit lines are floated, Vcc is applied to all source lines, and 0 V to the substrate.

When the nonvolatile memory device of FIG. 17A operates in the read mode, Vcc can be applied to a selected word line, 0 V to an unselected word line, 0.5 to 2 V to a selected $n^{th}$ bit line, 0 V to other bit lines, 0 V to all source lines, and 0 V to the substrate.

The voltages of FIG. 17B can be varied with structural characteristics or electrical parameters of the memory cells, for instance, the coupling coefficient or the thickness of tunnel insulator.

As described above, the present invention is advantageous in the following respects.

First, respective threshold level programming is accomplished merely by changing the voltage of the control gate thereby, facilitating multi-level programming.

Second, the respective threshold voltage levels and corresponding control gate voltages are linear, and the shift of the threshold voltage coincides with the shift of the control gate voltage, precisely adjusting the shift of the respective level threshold voltages.

Third, the state of erasure is controlled by the lowest level programming at an arbitrary control gate voltage, thereby eliminating over-erasure problem.

Fourth, programming and verifying are performed simultaneously in the nonvolatile memory cell itself, requiring no separate circuit for verifying programmed contents and making the speed of programming faster.

Fifth, pre-programming is not necessary prior to erasure.
Sixth, a small voltage below ±12 V is required for operation.
Seventh, only a small current below several or tens of $\mu$A is merely required for verification.

Eighth, the nonvolatile memory cell is constructed as a simple-stacked gate, not a split-channel, making it compact.
Ninth, the accuracy of multi-level programming, that is, the error distribution of programmed threshold voltages is precisely determined only by parameters fixed at the time of fabrication of the nonvolatile memory and by applied bias voltages. For this reason, the error distribution of the respective levels of the nonvolatile memory of the present invention is not dependent on the large number of program/erase cycles. Even during programming, the memory is not dependent on the trap of charges to the oxide layer, channel mobility, bit line resistance, and unstable or unpredictable electric elements.

Tenth, the programming method of the nonvolatile memory of the present invention is voltage-controlled, performing easier and more precise multi-level programming than the current-controlled method.

Eleventh, the nonvolatile memory device of the present invention accomplishes a contactless virtual ground array with a simple stacked-gate structure not an asymmetric cell like the split-channel structure, sharply reducing the size of chip.

Twelfth, the source and drain of the nonvolatile memory of the present invention are used only in reading, applying a low voltage required only for reading to the source and drain. This optimizes the diffusion area of the source and drain.

The foregoing description of preferred embodiment(s) of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A nonvolatile memory device comprising:
   a first conductivity-type semiconductor substrate having a channel region on its surface;
   a floating gate formed on said channel region;
   two impurity regions of a second conductivity-type formed on either side of said channel region within the surface of said semiconductor substrate;
   a control gate formed above said floating gate;
   a program gate formed adjacent to said floating gate for supplying charge carriers to said floating gate during programming; and
   an insulating layer formed between said program gate, said floating gate, and said control gate, said insulating layer being sufficiently thin between said floating gate and program gate to enable tunnelling therebetween.

2. A nonvolatile memory device as claimed in claim 1, further comprising a field insulating layer formed on a surface of said substrate surrounding said channel region.

3. A nonvolatile memory device as claimed in claim 2, wherein a portion of said floating gate extends to a surface of said field insulating layer.

4. A nonvolatile memory device as claimed in claim 1, wherein said program gate is formed adjacent to a side of said floating gate.

5. A nonvolatile memory device as claimed in claim 1, wherein said program gate is formed above said floating gate.

6. A nonvolatile memory device as claimed in claim 1, wherein said program gate is formed adjacent to a bottom portion of said floating gate.

7. A nonvolatile memory device as claimed in claim 1, further comprising a gate insulating layer formed between said channel region and said floating gate, and which is sufficiently thin to enable tunnelling therebetween.

8. A nonvolatile memory cell comprising:
   a first conductivity-type semiconductor substrate;
   a first impurity region, a second impurity region, and a third impurity region formed on the surface of said substrate and spaced apart by a predetermined distance, each of said first impurity region, said second impurity region, and said third impurity region being of a second conductivity-type;
   a first gate insulating layer formed over said first and second impurity regions on said substrate;
   a second gate insulating layer formed over said second and third impurity regions and having a different thickness from that of said first gate insulating layer;
   a first channel region defined as a region between said first and second impurity regions on the surface of said substrate;
   a second channel region defined as a region between said second and third impurity regions on the surface of said substrate;
   a floating gate formed over said first and third impurity regions on said first and second gate insulating layers;
   a control gate formed above said floating gate; and
   an insulating layer formed between said floating gate and said control gate.

9. A nonvolatile memory cell as claimed in claim 8, wherein said second gate insulating layer is thicker than said first gate insulating layer.

10. A nonvolatile memory cell as claimed in claim 8, wherein said first gate insulating layer is sufficiently thin to enable tunnelling for programming and erasure.

11. A nonvolatile memory cell as claimed in claim 8, wherein a field insulating layer is further formed on the surface of said substrate surrounding said first and second gate insulating layers.

12. A nonvolatile memory cell as claimed in claim 8, wherein a part of said floating gate extends to the surface of said field insulating layer.

* * * * *